(12) United States Patent
Roy

(10) Patent No.: US 6,408,937 B1
(45) Date of Patent: Jun. 25, 2002

(54) ACTIVE COLD PLATE/HEAT SINK

(76) Inventor: Sanjay K. Roy, P.O. Box 248433, Coral Gables, FL (US) 33124

(*) Notice: Subject to any disclaimer, the term of this patent is extended or adjusted under 35 U.S.C. 154(b) by 0 days.

(21) Appl. No.: 09/713,109

(22) Filed: Nov. 15, 2000

(51) Int. Cl.[7] .............................................. F28D 15/00
(52) U.S. Cl. ........................... 165/104.33; 165/104.22; 165/104.25; 165/104.31; 361/700; 257/715; 257/716; 174/15.1
(58) Field of Search ................................ 165/80.3, 80.4, 165/80.5, 104.33, 104.34, 104.22, 104.28, 104.31; 361/699, 700; 257/715, 716; 174/15.1

(56) References Cited

U.S. PATENT DOCUMENTS

| | | | | |
|---|---|---|---|---|
| 3,609,991 A | * | 10/1971 | Chu et al. ............... | 165/104.25 |
| 5,020,586 A | | 6/1991 | Mansingh .................. | 165/80.3 |
| 5,309,319 A | | 5/1994 | Messina ..................... | 361/699 |
| 5,316,077 A | * | 5/1994 | Reichard ............... | 165/104.28 |
| 5,390,077 A | | 2/1995 | Paterson ..................... | 361/700 |
| 5,441,102 A | * | 8/1995 | Burward-Hoy ......... | 165/104.25 |
| 5,731,954 A | * | 3/1998 | Cheon ....................... | 174/15.1 |
| 5,763,951 A | * | 6/1998 | Hamilton et al. ........... | 257/714 |
| 5,864,466 A | | 1/1999 | Remsburg ................... | 361/700 |
| 5,950,714 A | | 9/1999 | Schneider et al. .......... | 165/80.3 |
| 6,019,165 A | * | 2/2000 | Batchelder ................ | 165/80.4 |
| 6,021,844 A | * | 2/2000 | Batchelder ................ | 165/80.3 |
| 6,141,217 A | * | 10/2000 | Nakahama et al. .... | 165/104.33 |

* cited by examiner

Primary Examiner—Henry Bennett
Assistant Examiner—Terrell McKinnon
(74) Attorney, Agent, or Firm—Frank L. Kubler

(57) ABSTRACT

A heat sink apparatus for gathering and dissipating heat from a heat source having a heat source housing includes an impeller chamber having a chamber interior containing a heat transfer fluid and comprising a heat transfer wall for transferring heat from the heat source into the chamber; a heat transfer fluid within the chamber; a fluid circulation path including the chamber interior; a fluid propelling mechanism for propelling the fluid through the circulation path and across the heat transfer wall so that the fluid absorbs heat at the heat transfer wall and flows to a heat discharge region remote from the heat transfer wall where the heat is dissipated into the surrounding environment; where the fluid propelling mechanism includes a mechanical fluid driving structure including blades within the chamber rotatably secured to the apparatus with a blade mounting structure to move adjacent to and along the heat transfer wall and within the flow layer of the fluid adjacent to the heat transfer wall to mechanically force convection of the fluid close to the heat transfer wall. The blades preferably include an impeller having a central impeller hub and several impeller blades secured to and extending radially from the central impeller hub adjacent to and along the heat transfer wall and within the flow layer of the fluid adjacent to the heat transfer wall.

24 Claims, 3 Drawing Sheets

ACTIVE COLD PLATE/HEAT SINK

STATEMENT OF GOVERNMENT RIGHTS

This invention was made with Government support under contract DAAE07-98-C-L021 awarded by U.S. Army TACOM. The Government has certain rights in this invention.

BACKGROUND OF THE INVENTION

1. Field of the Invention

The present invention relates generally to the field of heat sink devices such as cold plates for transferring heat away from a heat source such as an electronic component or board to maintain the component within an optimum operating temperature range, so that the component can operate continuously and with maximized efficiency. A typical heat source would be an IGBT module used in power electronics such as in rectifiers, inverters and in welding equipment. More specifically the present invention relates to an active heat sink in the form of a cooling fluid circulating apparatus containing a fluid circulation path which is configured to prevent the formation of stagnant fluid dead spaces and which mechanically moves fluid at high velocity adjacent to the heat source.

The apparatus includes a housing containing a heat transfer chamber which in turn contains a heat transfer fluid, part of the chamber being defined by a heat transfer wall through which heat is received from the heat source, a fluid circulation path, a heat dissipating enclosure and fluid propelling means for causing the fluid to circulate through the circulation path and across the heat transfer wall so that the fluid absorbs heat from the heat transfer wall and flows into the heat dissipating enclosure remote from the heat transfer wall where the heat is dissipated into the surrounding environment. The fluid propelling means is preferably an impeller mounted so that the impeller blades pass very close to the heat transfer wall.

2. Description of the Prior Art

There have long been heat transfer devices in the form of heat sinks and cold plates for transferring heat away from various electronic elements so that the temperatures of these devices remain within acceptable limits so that the devices operate at higher efficiency and require less shut down time for cooling. These have included simple heat sinks mounted on individual components to provide larger surface areas for enhanced dissipation of heat to the surrounding atmosphere either by natural or forced convection. For high power systems, entire boards have been mounted on liquid-cooled heat exchangers such as cold plates which transfer the waste heat to the atmosphere via a liquid-air radiator. The entire flow loops usually include pumps, valves, drive motors, other components as required for specific applications.

Paterson, U.S. Pat. No. 5,390,077, issued on Feb. 14, 1995, discloses an integrated circuit cooling device having an internal baffle. Paterson includes a cooling fluid chamber which rests on top of a heat source and contains cooling fluid in both liquid and gaseous phases. The cooling fluid evaporates within the chamber, rises between two upwardly tapering barrier structures to emerge from the middle of these structures and make contact with cooler upper and side chamber walls having heat fins, where it condenses and falls back around the outer periphery of the barrier structures into the liquid phase pool of cooling fluid.

Remsburg, U.S. Pat. No. 5,864,466, issued on Jan. 26, 1999 teaches a thermosyphon-powered jet-impingement cooling device similar in general design to Paterson, except that the condensed cooling fluid returns to the pool of liquid fluid at the center of the barrier structure and causes a boundary layer minimizing jet action against the heat source abutting wall of the chamber.

Other liquid and gaseous fluid flow cooling devices found in the search are Schneider, et al., U.S. Pat. No. 5,950,714, issued on Sep. 14, 1999 for a tubular cooling apparatus for an electronic component, the tube containing a venturi member; Messina, U.S. Pat. No. 5,309,319, issued on May 3, 1994 for an integral cooling system for electric components; Mansingh, U.S. Pat. No. 5,020,586, issued on Jun. 4, 1991 for an air-cooled heat exchanger for electronic circuit modules; and Reichard, U.S. Pat. No. 5,316,077, issued on May 31, 1994 for a heat sink for electrical circuit components.

It is thus an object of the present invention to provide a heat sink apparatus containing a heat transfer fluid which transfers heat away from a heat source through a heat transfer wall with greater efficiency than existing cold plates by mechanically forcing cooling fluid flow within the flow layer of the fluid along the heat transfer wall.

It is another object of the present invention to provide such a heat sink apparatus which distributes fluid uniformly over the entire heat transfer wall so that there are no dead spaces in which fluid flow is substantially static.

It is still another object of the present invention to provide such a heat sink apparatus in which very high heat transfer rates are possible over large surface areas, system pressures are relatively low, both modular and integrated designs are feasible, special heat transfer fluids can be used in modules, and in which design is scalable.

It is yet another object of the present invention to provide such a heat sink apparatus which provides an internal pumping effect so that the external pump may be omitted in many cases.

It is finally an object of the present invention to provide such a heat sink apparatus which is economical to manufacture and reliable.

SUMMARY OF THE INVENTION

The present invention accomplishes the above-stated objectives, as well as others, as may be determined by a fair reading and interpretation of the entire specification.

A heat sink apparatus is provided for gathering and dissipating heat from a heat source having a heat source housing, the apparatus including an impeller chamber having a chamber interior containing a heat transfer fluid and comprising a heat transfer wall for transferring heat from the heat source into the chamber; a heat transfer fluid within the chamber; a fluid circulation path including the chamber interior; a fluid propelling mechanism for propelling the fluid through the circulation path and across the heat transfer wall so that the fluid absorbs heat at the heat transfer wall and flows to a heat discharge region remote from the heat transfer wall where the heat is dissipated into the surrounding environment; where the fluid propelling mechanism includes a mechanical fluid driving structure including blades within the chamber rotatably secured to the apparatus with a blade mounting structure to move adjacent to and along the heat transfer wall and within the flow layer of the fluid adjacent to the heat transfer wall to mechanically force convection of the fluid close to the heat transfer wall.

The impeller chamber preferably includes a first chamber end wall and a second chamber end wall and a circumferential side wall sealingly interconnecting the first chamber end wall and the second chamber end wall, and where the first chamber end wall is the heat transfer wall and where the second chamber end wall includes an outer periphery and a central fluid entry port and a fluid exit port at the outer periphery of the first chamber end wall; so that the fluid is delivered into the chamber through the fluid entry port and the fluid impinges upon an opposing central region of the first chamber end wall and flows radially outward from the central region in all directions, across the first chamber end wall and toward the circumferential side wall, and then diverts away from the first chamber end wall, through the fluid exit port and into the heat dissipating enclosure from which heat gathered from the heat source is dissipated into the outside environment, and the fluid within the heat dissipating chamber then flows again through the fluid entry port into the chamber thereby completing a repeating flow cycle.

The central fluid port preferably contains a fluid guide tube extending substantially perpendicular to the second chamber end wall, so that the fluid guide tube receives and passes fluid as the fluid passes from the heat dissipating enclosure into the chamber. The blades preferably include an impeller having a central impeller hub and several impeller blades secured to and extending radially from the central impeller hub adjacent to and along the heat transfer wall and within the flow layer of the fluid adjacent to the heat transfer wall, and includes an impeller drive shaft joined to the impeller hub and passing through the fluid entry port and sealingly through a drive shaft port in the heat dissipating enclosure. The heat transfer fluid may flow through an axial passageway in the impeller drive shaft and/or around the shaft, between the shaft and the edges of the opening for the drive shaft. The impeller drive shaft is preferably the fluid guide tube.

The apparatus preferably additionally includes an electric impeller drive motor drivably connected to the impeller drive shaft, and an electric motor power circuit and a motor power source within the motor power circuit. Fan blades are preferably provided on the impeller drive shaft outside the heat dissipating enclosure for blowing air over the heat dissipating enclosure.

The heat dissipating enclosure preferably includes a heat dissipating enclosure wall with an enclosure wall outer surface comprising a surface area increasing structure. The surface area increasing structure preferably includes at least one heat fin. The heat transfer wall in most cases is planar to fit snugly against a heat source housing surface, and the heat transfer wall is pressed against the heat source housing to maximize heat transfer. Alternatively, the heat transfer wall is integral with the heat sink housing so that the heat transfer wall is also a wall of the heat sink housing.

The apparatus optionally additionally includes a tube passing through the heat dissipating enclosure to enhance cooling using a second heat transfer fluid. The apparatus optionally includes a turbine drivably connected to the impeller shaft, and the heat transfer fluid is pumped through the turbine at high pressure to drive it and the impeller. The impeller drive shaft optionally includes at least one fluid mixing blade extending laterally from the impeller drive shaft within the heat dissipating enclosure.

Where heat transfer wall is curved, the fluid drive mechanism optionally includes a vane pump with the impeller passing within the fluid layer adjacent to the heat transfer wall, or optionally includes a driven belt passing within the fluid layer along the heat transfer wall.

BRIEF DESCRIPTION OF THE DRAWINGS

Various other objects, advantages, and features of the invention will become apparent to those skilled in the art from the following discussion taken in conjunction with the following drawings, in which.

DETAILED DESCRIPTION OF THE PREFERRED EMBODIMENTS

Figure 1:
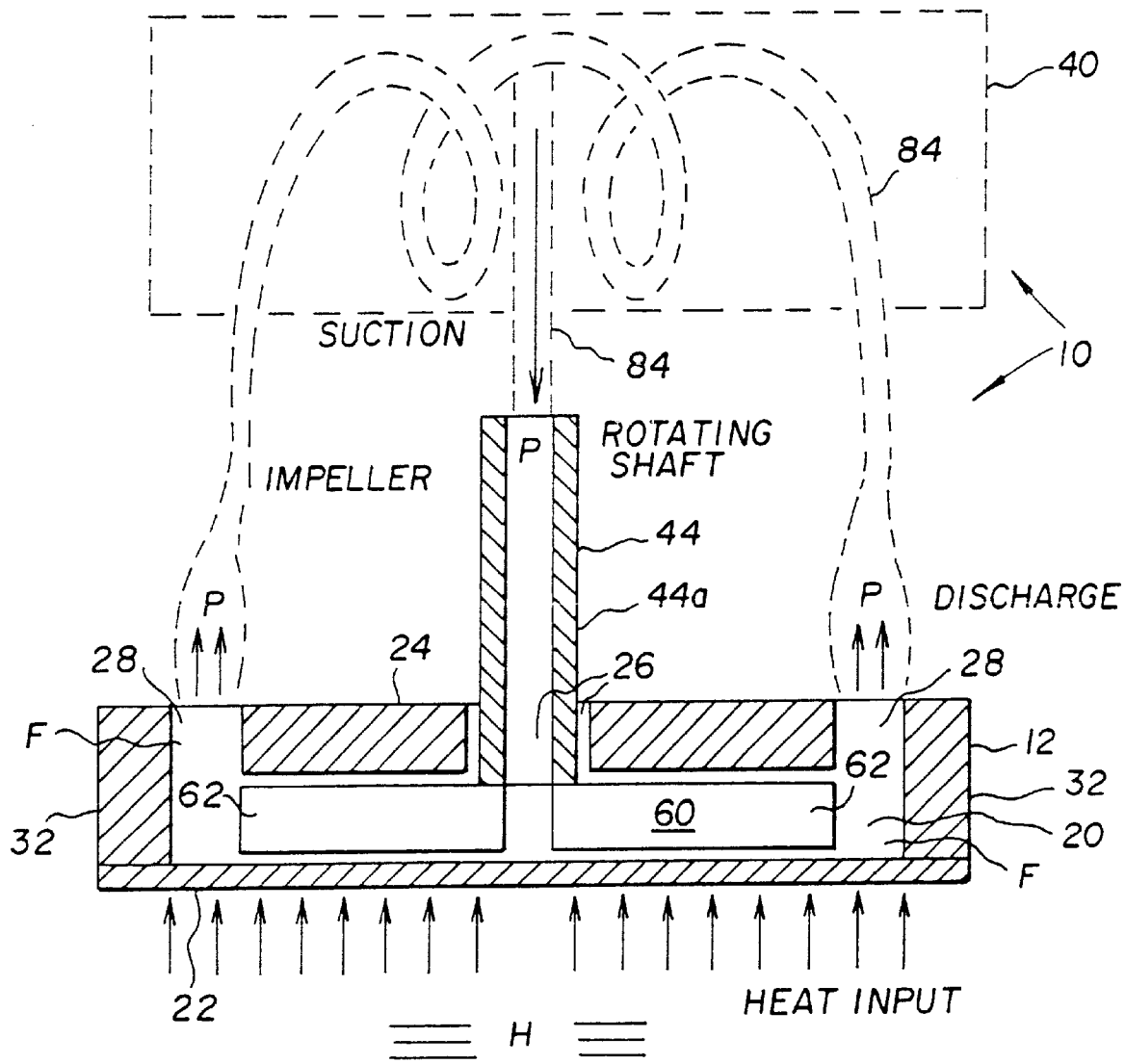
FIG. 1 is a cross-sectional side view of the apparatus having a coiled tube external heat dissipating enclosure.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various FIGURES are designated by the same reference numerals.

First Preferred Embodiment

Figure 2:
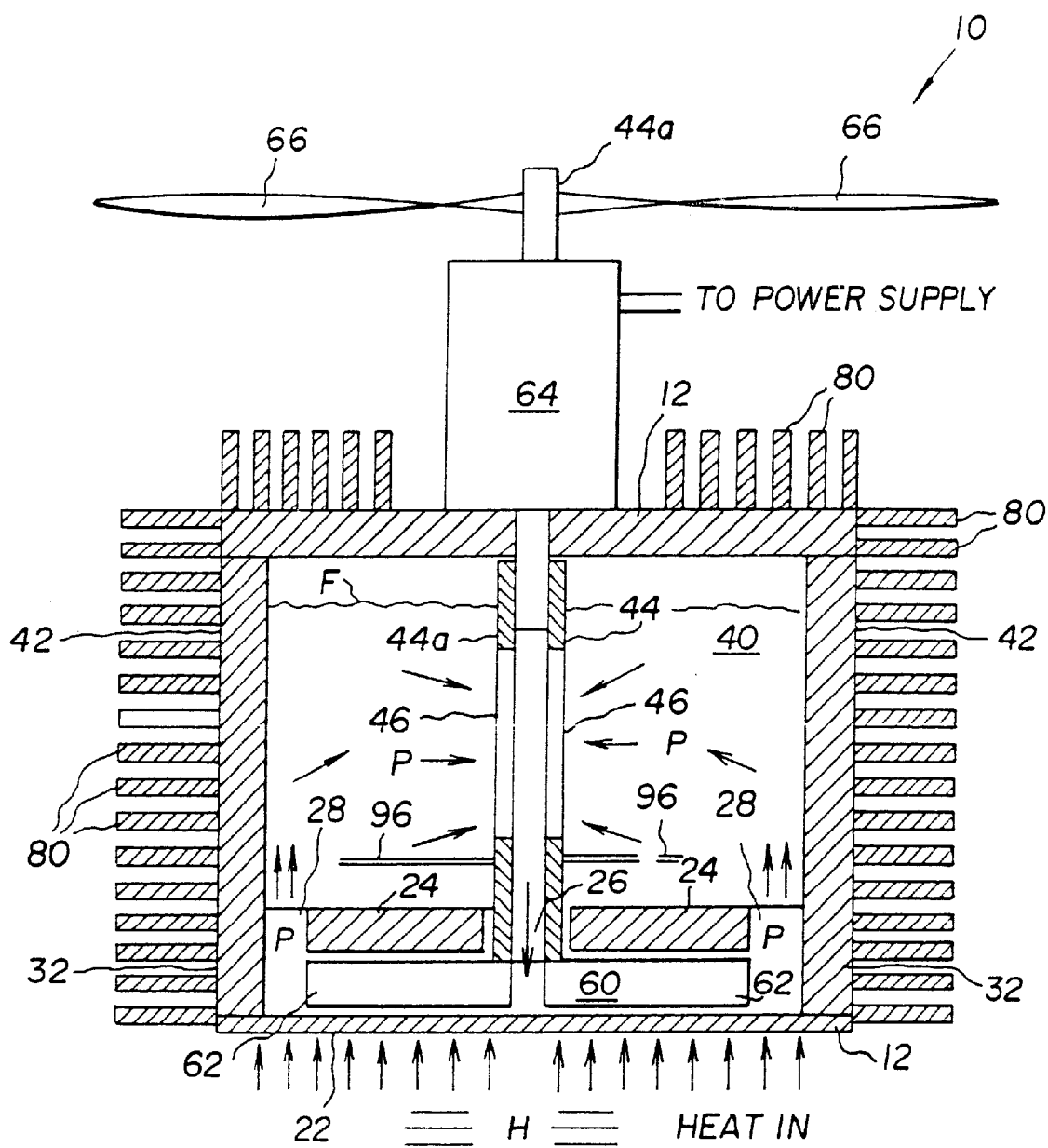
FIG. 2 is a cross-sectional side view of the apparatus having an integral heat dissipating enclosure within a common housing with the impeller chamber and an impeller electric drive motor.
Figure 3:
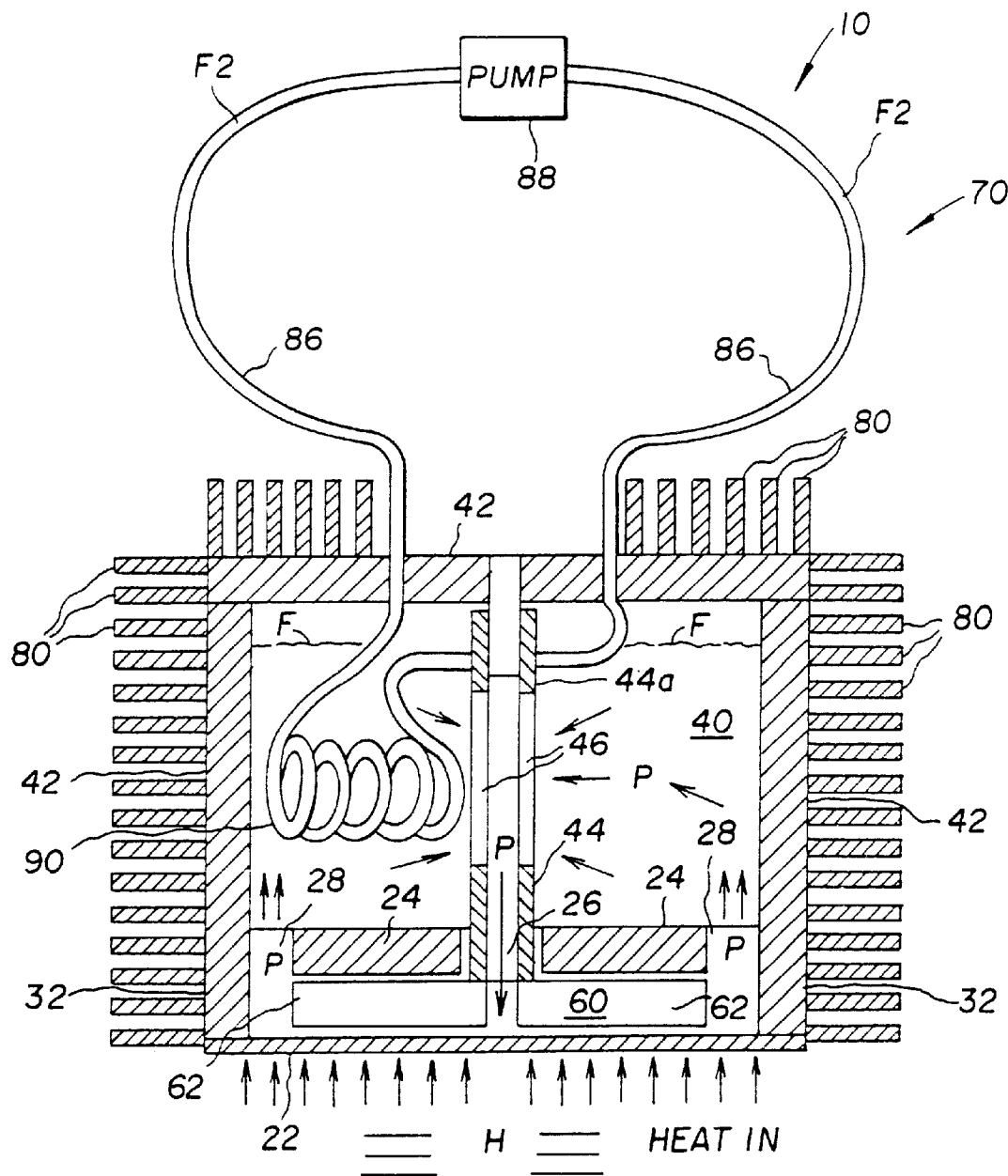
FIG. 3 is a view as in FIG. 2 with a second heat transfer fluid circuit and pump functioning to carry heat away from the first heat transfer fluid within the heat dissipating enclosure.

Referring to FIGS. 1–3, an active heat sink is disclosed in the form of a cooling fluid circulating apparatus 10 for transferring heat away from a heat source H such as an electrical component, apparatus 10 containing a fluid circulation path P which is configured to prevent the formation of stagnant fluid dead spaces and which mechanically moves fluid at high velocity within the region adjacent to the heat source H.

Apparatus 10 includes an apparatus housing 12 containing an impeller chamber 20 which in turn contains a heat transfer fluid F, part of the chamber 20 being defined by a heat transfer wall 22 through which heat is received from the heat source H, a fluid circulation path P, a heat dissipating enclosure 40 and fluid propelling means 60 for causing the fluid F to circulate through the circulation path P and across the heat transfer wall 22 so that the fluid F absorbs heat from the heat transfer wall 22 and flows to the heat dissipating enclosure 40 remote from the heat transfer wall 22 where absorbed heat is dissipated into the surrounding environment.

Heat transfer wall 22 is preferably made of aluminum or other high thermal conductivity material and is preferably planar to fit snugly against most heat source H housings such as those of electronic components, and is preferably either pressed against the heat source H housing to maximize heat transfer or is manufactured integrally with the heat source H housing so that the heat transfer wall 22 is also a wall of the heat source H housing.

Impeller chamber 20 is arbitrarily shown as cylindrical, having a diameter which is several times the axial length of the chamber 20. A disk-shaped first chamber end wall is the heat transfer wall 22, and an opposing disk-shaped second chamber end wall 24 has a fluid entry port 26 at its center and has a fluid exit port 28 at its perimeter. A circumferential side wall 32 integrally interconnects the first and second chamber end walls 22 and 24, respectively.

Fluid F is delivered into the chamber 20 through the fluid entry port 26 so that the fluid F impinges upon the opposing center region of the disk-shaped first chamber end wall 22 and flows radially outward from the center region in all directions, across the first chamber end wall 22 and toward the circumferential side wall 32. As the fluid F reaches the circumferential side wall 32 it diverts away from the first chamber end wall 22 and into the fluid exit port 28. From the fluid exit port 28 the fluid F passes into and through the heat dissipating enclosure 40 where the heat gathered from the heat source H is transferred to the outside environment.

The fluid cooling path P may be entirely internal to the apparatus housing 12 as illustrated in FIGS. 2 or 3. In this case, the heat is dissipated from the heat dissipating enclosure 40 through the heat dissipating enclosure wall 42 which becomes integral with the circumferential side wall 32. Alternatively, the heat dissipating enclosure 40 may be external to the housing 12, taking the form of an external tube 84, which may be coiled, as in FIG. 1 or concentric tubes (not shown) with a second heat transfer fluid passing through the outer concentric tube, as is common in vapor condenser design, or may take the form of a tube extending within the housing 12. External tube 84 optionally includes a supplemental pump (not shown) to increase the rate of fluid circulation.

Fluid F exits the heat dissipating enclosure 40 and reenters the impeller chamber 20 through a fluid guide tube 44 passing through fluid entry port 26 in the second chamber end wall 24, so that the circulation cycle repeats. For the case where the fluid cooling path P is entirely internal, the fluid guide tube 44 may include lateral tube openings 46 through which fluid F is received from the heat dissipating enclosure 40.

A key inventive feature of apparatus 10 is the inclusion of a fluid driving structure as the fluid propelling means for mechanically forcing fluid F to flow within the region adjacent to the heat transfer wall 22. In most cases, this would be within 0.5 mm of the surface of the heat transfer wall 22, to increase the rate of heat transfer through the heat transfer wall 22 from the heat source H. The preferred fluid driving structure is an impeller 60 mounted within the chamber 20 so that the impeller blades 62 extend radially, in a straight or curved fashion, from the cylinder axis of the chamber 20 outwardly to approach the circumferential side wall 32. The impeller 60 is optionally partially shrouded, with the shrouding disk on the side of the impeller blades 62 adjacent to the second chamber end wall 24 to enhance fluid velocity at heat transfer wall 22. The impeller 60 is preferably mounted on an impeller drive shaft 44a. The fluid guide tube 44 preferably functions as the impeller drive shaft, so that fluid F adjacent to the end of the impeller drive shaft does not remain stagnant, but is propelled against the heat transfer wall 22 with jet impingement. The impeller drive shaft 44a preferably is driven by an electric motor 64 mounted to the exterior of the heat dissipating enclosure 40, and the impeller drive shaft 44a extends through a drive shaft port 46 in the heat dissipating enclosure 40 into the motor 64. See FIG. 2. The impeller drive shaft 44a optionally extends through the motor 64 and out of the opposing side of the motor 64, and fan blades 66 are preferably attached to the end of the impeller drive shaft 44a protruding out of the motor 64 so that fan blades 66 rotate with the impeller 60 and propel air outside apparatus housing 12 over the exterior of the heat dissipating enclosure 40 to accelerate heat transfer through and out of the heat dissipating enclosure wall 42. Alternatively, a magnetic, hydraulic, pneumatic, belt 94, gear or other drive (not shown) may be substituted for motor 64. Heat fins 80 or other surface area increasing structures are preferably provided on the exterior of the heat dissipating enclosure wall 42 to further accelerate the dissipation of heat through the wall 42. It is also contemplated that the impeller 60 be driven by the circulation of the fluid F through its fluid circulation path P by an integrated turbine drive system.

It is further contemplated that the heat transfer wall 22 is optionally large enough relative to the sizes of the heat sources H that several heat sources H may be mounted to the heat transfer wall 22 of a single apparatus 10 in a radial/circumferential fashion.

A liquid or gas heat exchanger 70 may be provided including an internal cooling coil 90 in the form of a second heat transfer fluid passing tube 86 passing through the heat dissipating enclosure 40 in a surface area maximizing coiled configuration. This tube 86 carries a second heat transfer fluid F2 which may be delivered by a second heat transfer fluid pump 88.

A stirrer may be provided in the form of radial mixing blades 96 or rods on the impeller drive shaft 44a within the heat dissipating enclosure 40 to enhance heat dissipating efficiency. See FIG. 2.

Alternative Configuration

The geometry of the above configuration is axisymmetric. Thus instead of a planar geometry, the first chamber end wall 22 in alternative designs can have a spherical, conical or other similar axisymmetric shape. The impeller 60 and impeller blades 62 must then be modified to match the shape of the first chamber end wall 22.

Figure 4:
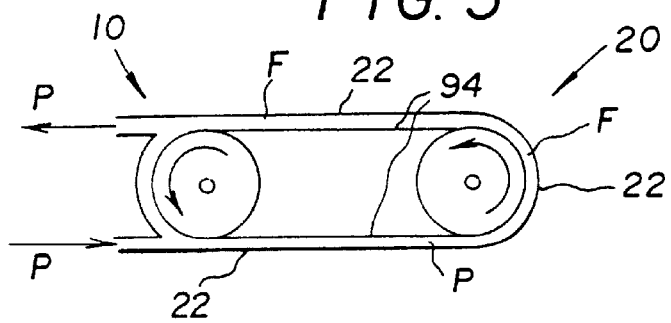
FIG. 4 is a cross-sectional side view of the belt fluid drive alternative to the impeller, passing within the fluid layer adjacent to the heated surface.

While the heat transfer wall 22 is usually planar, or sometimes axisymmetric, the use of otherwise configured heat transfer walls 22 is also contemplated where the heat source H housing is similarly configured. For example, a belt 94 may be used where the heat transfer wall 22 is planar or curved but not axisymmetric. See FIG. 4. Alternatively, configurations similar to axial flow or rotary pumps (e.g. vane pumps) or compressors may be utilized when the heat transfer wall 22 is cylindrical.

As another variation, it is contemplated that the impeller may remain stationary relative to the impeller chamber 20 and the jet impingement of heat transfer fluid F at the center of the impeller is sufficient to throw the fluid F radially outward between the impeller blades 62 in a straight or curved path depending on the geometry of the impeller blades 62.

As yet another variation, the heat transfer fluid F may flow around impeller drive shaft 44a through a central annular opening in the impeller shroud, from which the rotation of impeller 60 directs the fluid F radially outward. This configuration is suited to applications in which the heat load at the central region of the first chamber wall 22 is low so that jet impingement is not necessary, for example in a case where multiple heat sources H are distributed around the heat transfer wall 22 radially outward from the impeller center.

In many applications with low heat loads in the central region of the heat transfer wall 22 as above, the fluid flow path P may also be configured in a reverse manner such that the fluid exit port 28 functions as an entry port and the fluid entry port 26 functions as an exit port. In these cases, the designs may be based on a stationary impeller or a turbine drive system.

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim as my invention:

1. A heat sink apparatus for gathering and dissipating heat from a heat source having a heat source housing, the apparatus comprising:

an impeller chamber having a chamber interior and containing a heat transfer fluid and comprising a heat transfer wall for transferring heat from said heat source into said chamber;

a heat transfer fluid within said chamber;

a fluid circulation path including said chamber interior which is configured to prevent the formation of stagnant fluid dead spaces;

and fluid propelling means for propelling said fluid through said circulation path and across said heat transfer wall such that said fluid absorbs heat at said heat transfer wall and flows to a heat discharge region remote from said heat transfer wall where the heat is dissipated into the surrounding environment;

wherein said fluid propelling means comprising a mechanical fluid driving structure for rapidly moving fluid across a wall adjacent to the heat source;

wherein the heat transfer wall comprises one of: a planar surface, and an axisymmetric surface;

wherein said fluid propelling means comprises a rotating impeller forcing the fluid in a radial fashion over said heat transfer wall;

wherein said heat discharge region comprises a heat dissipating enclosure, and wherein said impeller chamber comprises a first chamber end wall and a second chamber end wall and a circumferential side wall sealingly interconnecting said first chamber end wall and said second chamber end wall, and wherein said first chamber end wall is said heat transfer wall and wherein said second chamber end wall comprises an outer periphery and a substantially central fluid entry port and a fluid exit port at said outer periphery of said second chamber end wall;

such that said fluid is delivered into said chamber through said fluid entry port and said fluid impinges upon an opposing substantially central region of said first chamber end wall and flows radially outward from the substantially central region in all directions, across said first chamber end wall and toward said circumferential side wall, and then diverts away from said first chamber end wall, through said fluid exit port and into said heat dissipating enclosure from which heat gathered from said heat source is dissipated into the outside environment, and the fluid within said heat dissipating enclosure then flows again through said fluid entry port into said chamber thereby completing a repeating flow cycle.

2. The apparatus of claim 1, wherein said central fluid port contains a fluid guide tube extending substantially perpendicular to said second chamber end wall, such that said fluid guide tube receives and passes fluid as said fluid passes from said heat dissipating enclosure into said impeller chamber.

3. The apparatus of claim 1, wherein said fluid propelling means comprises an impeller having a central impeller hub and a plurality of impeller blades secured to and extending radially from said central impeller hub adjacent to and along said heat transfer wall and within the layer of said fluid adjacent to said heat transfer wall, and comprises an impeller drive shaft joined to said impeller hub and passing through said fluid entry port and sealingly through a drive shaft port in said heat dissipating enclosure.

4. The apparatus of claim 3, wherein said impeller drive shaft is said fluid guide tube.

5. The apparatus of claim 3, additionally comprising impeller drive means drivably connected to said impeller drive shaft.

6. The apparatus of claim 3, additionally comprising fan blades on said impeller drive shaft outside said heat dissipating enclosure for blowing air over said heat dissipating enclosure.

7. The apparatus of claim 1, wherein said heat dissipating enclosure comprises a heat dissipating enclosure wall with an enclosure wall outer surface comprising a surface area increasing structure.

8. The apparatus of claim 7 wherein said surface area increasing structure comprises at least one heat fin.

9. The apparatus of claim 1, wherein said heat transfer wall is integral with the heat sink housing such that said heat transfer wall is also a wall of the heat sink housing.

10. The apparatus of claim 4, wherein said fluid guide tube comprises a lateral opening within said heat dissipating enclosure for receiving said fluid.

11. The apparatus of claim 5, wherein said impeller drive means comprises one of: an electric motor, a hydraulic drive, a pneumatic drive, a belt drive, a gear drive, a magnetic drive, and an integrated turbine drive.

12. The apparatus of claim 3, wherein said impeller drive shaft comprises at least one fluid mixing blade extending laterally from said impeller drive shaft within said heat dissipating enclosure.

13. The apparatus of claim 1, wherein the impeller comprises mechanical fluid driving structure including blade means within said chamber rotatably secured to said apparatus with blade mounting means to move adjacent and along said heat transfer wall to mechanically force said fluid close to said heat transfer wall.

14. A heat sink apparatus for gathering heat from a heat source having a heat source housing, the apparatus comprising:

a heat sink chamber having a chamber interior and containing a heat transfer wall for transferring heat from said heat source into said chamber; said heat sink chamber comprising a first chamber end wall and a second chamber end wall and a circumferential side wall sealingly interconnecting said first chamber end wall and second chamber end wall; wherein said first chamber end wall is said heat transfer wall and wherein said second chamber end wall comprises an outer periphery and a central fluid entry port and a fluid exit port at said outer periphery of said second chamber end wall;

a fluid circulation path including said chamber interior which is configured to prevent the formation of stagnant fluid dead spaces;

and fluid directing means for directing said fluid through said fluid circulation path and across said heat transfer wall such that said fluid absorbs heat at said heat transfer wall and flows to a heat discharge region remote from said heat transfer wall where heat is dissipated into the surrounding environment, said fluid directing means comprising a stationary structure directing the fluid in a radial fashion over said heat transfer wall;

wherein said stationary structure comprises a plurality of blades extending radially from said central fluid entry port adjacent to and along heat transfer wall and within the layer of said fluid adjacent to said heat transfer wall;

such that said fluid is delivered into said chamber through said chamber entry port and said fluid impinges upon an opposing central region of said first chamber end wall and flows radially outward from the central region in all directions, across said first chamber end wall and towards circumferential side wall, and then diverts away from said first chamber end wall, through said fluid exit port to said heat discharge region from where heat is dissipated into the outside environment, then flows back again through said fluid entry port into said chamber thereby completing a repeating flow cycle.

15. A heat sink apparatus for gathering and dissipating heat from a heat source having a heat source housing using a heat transfer fluid, the apparatus comprising:

an impeller chamber having a chamber interior and containing the heat transfer fluid and comprising a heat transfer wall for transferring heat from said heat source into said chamber, said chamber containing the heat transfer fluid;

a fluid circulation path including said chamber interior which is configured to prevent the formation of stagnant fluid dead spaces; and fluid propelling means for propelling said fluid through said circulation path and across said heat transfer wall such that said fluid absorbs heat at said heat transfer wall and flows to a heat discharge region remote from said heat transfer wall where the heat is dissipated into the surrounding environment;

wherein said fluid propelling means comprising a mechanical fluid driving structure for rapidly moving fluid across a wall adjacent to the heat source;

wherein the heat transfer wall comprises one of: a planar surface, and an axisymmetric surface;

wherein said fluid propelling means comprises a rotating impeller forcing the fluid in a radial fashion over said heat transfer wall;

wherein said impeller chamber comprises a first chamber end wall and a second chamber end wall and a circumferential side wall sealingly interconnecting said first chamber end wall and said second chamber end wall, and wherein said first chamber end wall is said heat transfer wall and wherein said second chamber end wall comprises an outer periphery and a substantially central fluid entry port and a fluid exit port at said outer periphery of said second chamber end wall;

such that said fluid is delivered into said chamber through said fluid entry port and said fluid impinges upon an opposing substantially central region of said first chamber end wall and flows radially outward from the substantially central region in all directions, across said first chamber end wall and toward said circumferential side wall, and then diverts away from said first chamber end wall, through said fluid exit port.

16. The apparatus of claim 15, wherein said substantially central fluid port contains a fluid guide tube extending substantially perpendicular to said second chamber end wall, such that said fluid guide tube receives and passes fluid as said fluid passes from said heat dissipating enclosure into said impeller chamber.

17. The apparatus of claim 15, wherein said fluid propelling means comprises an impeller having a substantially central impeller hub and a plurality of impeller blades secured to and extending radially from said substantially central impeller hub adjacent to and along said heat transfer wall and within the layer of said fluid adjacent to said heat transfer wall, and comprises an impeller drive shaft joined to said impeller hub and passing through said fluid entry port and sealingly through a drive shaft port in said heat dissipating enclosure.

18. The apparatus of claim 17, wherein said impeller drive shaft is said fluid guide tube.

19. The apparatus of claim 17, additionally comprising impeller drive means drivably connected to said impeller drive shaft.

20. The apparatus of claim 15, wherein said heat transfer wall is integral with the heat sink housing such that said heat transfer wall is also a wall of the heat sink housing.

21. The apparatus of claim 19, wherein said impeller drive means comprises one of: an electric motor, a hydraulic drive, a pneumatic drive, a belt drive, a gear drive, a magnetic drive, and an integrated turbine drive.

22. The apparatus of claim 17, wherein said impeller drive shaft comprises at least one fluid mixing blade extending laterally from said impeller drive shaft within said heat dissipating enclosure.

23. A heat sink apparatus for gathering and dissipating heat from a heat source having a heat source housing using a heat transfer fluid, the apparatus comprising:

an impeller chamber having a chamber interior and containing the heat transfer fluid and comprising a fluid entry port and a fluid exit port and a heat transfer wall for transferring heat from said heat source into said chamber, said chamber containing the heat transfer fluid;

a fluid circulation path including said chamber interior which is configured to prevent the formation of stagnant fluid dead spaces;

and fluid propelling means for propelling said fluid through said circulation path and across said heat transfer wall such that said fluid absorbs heat at said heat transfer wall and flows to a heat discharge region remote from said heat transfer wall where the heat is dissipated into the surrounding environment;

wherein said fluid propelling means comprising a mechanical fluid driving structure for rapidly moving fluid across a wall adjacent to the heat source;

wherein the heat transfer wall comprises one of: a planar surface, and an axisymmetric surface;

wherein said fluid propelling means comprises a rotating impeller forcing the fluid over said heat transfer wall;

wherein said impeller chamber comprises a first chamber end wall and a second chamber end wall and a circumferential side wall interconnecting said first chamber end wall and said second chamber end wall, and wherein said heat transfer wall is one of said first chamber end wall, said second chamber end wall and said circumferential side wall;

such that said fluid is delivered into said chamber through said fluid entry port and exits through said exit port.

24. A heat sink apparatus for gathering and dissipating heat from a heat source having a heat source housing using a heat transfer fluid, the apparatus comprising:

an impeller chamber having a chamber interior and containing the heat transfer fluid and comprising a substantially central fluid entry port and a fluid exit port and a heat transfer wall for transferring heat from said heat source into said chamber, said chamber containing the heat transfer fluid;

a fluid circulation path including said chamber interior which is configured to prevent the formation of stagnant fluid dead spaces;

and fluid propelling means for propelling said fluid through said circulation path and across said heat transfer wall such that said fluid absorbs heat at said heat transfer wall and flows to a heat discharge region remote from said heat transfer wall where the heat is dissipated into the surrounding environment;

wherein said fluid propelling means comprising a mechanical fluid driving structure for rapidly moving fluid across a wall adjacent to the heat source;

wherein the heat transfer wall comprises one of: a planar surface, and an axisymmetric surface;

wherein said fluid propelling means comprises a rotating impeller forcing the fluid over said heat transfer wall;

such that said fluid is delivered into said chamber through said fluid entry port and exits through said exit port.

* * * * *